United States Patent
Carney et al.

(10) Patent No.: US 7,875,964 B2
(45) Date of Patent: Jan. 25, 2011

(54) MULTI-CHIP SEMICONDUCTOR CONNECTOR AND METHOD

(75) Inventors: Francis J. Carney, Gilbert, AZ (US);
Phillip Celaya, Gilbert, AZ (US);
Joseph K. Fauty, Mesa, AZ (US);
James P. Letterman, Mesa, AZ (US);
Stephen St. Germain, Scottsdale, AZ (US); Jay A. Yoder, Phoenix, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 206 days.

(21) Appl. No.: 11/672,102

(22) Filed: Feb. 7, 2007

(65) Prior Publication Data

US 2007/0126106 A1   Jun. 7, 2007

(51) Int. Cl.
*H01L 23/495*   (2006.01)
*H01L 23/02*   (2006.01)

(52) U.S. Cl. .................. 257/673; 257/666; 257/686; 257/E23.039

(58) Field of Classification Search ............... 257/673, 257/666, 686, 777, E23.039
See application file for complete search history.

(56) References Cited

U.S. PATENT DOCUMENTS

| | | | | |
|---|---|---|---|---|
| 4,363,076 A | * | 12/1982 | McIver | 361/718 |
| 4,982,265 A | * | 1/1991 | Watanabe et al. | 257/737 |
| 5,331,235 A | * | 7/1994 | Chun | 257/777 |
| 5,471,369 A | * | 11/1995 | Honda et al. | 361/813 |
| 5,677,567 A | * | 10/1997 | Ma et al. | 257/666 |
| 6,650,019 B2 | * | 11/2003 | Glenn et al. | 257/777 |
| 2001/0017410 A1 | * | 8/2001 | Akram | 257/724 |
| 2002/0171130 A1 | * | 11/2002 | Takahashi et al. | 257/673 |
| 2005/0224945 A1 | * | 10/2005 | Saito et al. | 257/686 |

* cited by examiner

*Primary Examiner*—Nitin Parekh
(74) *Attorney, Agent, or Firm*—Robert F. Hightower

(57) ABSTRACT

In one exemplary embodiment, a multi-chip connector is formed to have a first conductive strip that is suitable for attaching to a first semiconductor die and a second conductive strip that is attached suitable for attaching to a second semiconductor die.

9 Claims, 9 Drawing Sheets

MULTI-CHIP SEMICONDUCTOR CONNECTOR AND METHOD

CROSS-REFERENCE TO RELATED APPLICATIONS

The present application is based on prior U.S. application Ser. No. 10/877,327, filed on 28 Jul. 2004, which is hereby incorporated herein by reference, and priority thereto for common subject matter is hereby claimed. Additionally, this application is related to an application entitled "Multi-Chip Semiconductor Connector Assembly Method" that has a U.S. patent application Ser. No. 10/877,165 and that matured into U.S. Pat. No. 7,202,105, having inventors Carney et al and filed concurrently herewith and to an application entitled "Multi-Chip Semiconductor Connector Assemblies" that has a U.S. patent application Ser. No. 10/877,325, having inventors Carney et al filed concurrently herewith, both of which are hereby incorporated herein by reference.

BACKGROUND OF THE INVENTION

The present invention relates, in general, to electronics, and more particularly, to methods of forming semiconductor devices and packaging therefor.

In the past, the semiconductor industry utilized a variety of package configurations to increase the packing density of semiconductor die in a system. The increased demand for electronic devices increased the demand for smaller, lighter, and yet more functional semiconductor devices and resulted in a demand for semiconductor packages that had increased semiconductor packaging densities with smaller outlines and mounting footprints. In some embodiments, semiconductor die were vertically stack on top of one another with an interposing layer of adhesive to attached to the semiconductor die in order to attach the die together. The die were then attached to a glass-epoxy type printed circuit board substrate or other similar substrate. The semiconductor die were then wire bonded to the substrate to form electrical interconnections between the substrate and the semiconductor die. One example of such a package configuration is disclosed in U.S. Pat. No. 6,650,019 issued to Thomas B. Glenn et al on Nov. 18, 2003.

It often took considerable horizontal space to wire bond to both of the semiconductor die which increased the footprint. Further, wire bonding to the semiconductor die consumed additional vertical space which increased the height. Another problem with such a configuration was thermal dissipation. The attachment medium used to attach the two die together often had low thermal conductivity, which reduced the thermal conductivity of the configuration and minimized the power dissipation capability of the configuration.

Accordingly, it is desirable to have a means of attaching multiple die together that provides high thermal conductivity, that does not require wire bonding, and that has a small footprint.

BRIEF DESCRIPTION OF THE DRAWINGS

For simplicity and clarity of illustration, elements in the figures are not necessarily to scale, and the same reference numbers in different figures denote the same elements. Additionally, descriptions and details of well-known steps and elements are omitted for simplicity of the description.

DETAILED DESCRIPTION OF THE DRAWINGS

Figure 1:
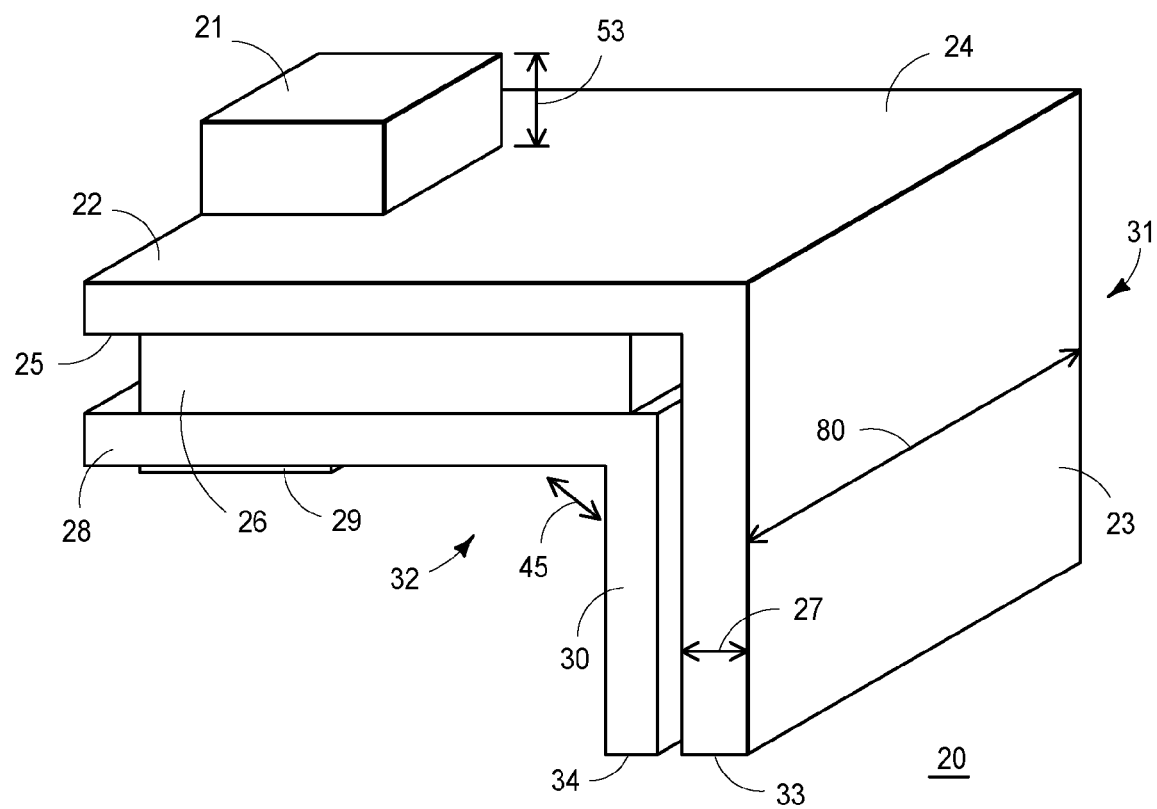
FIG. 1 schematically illustrates a highly enlarged isometric view of a portion of an embodiment of a multi-chip semiconductor connector in accordance with the present invention.

FIG. 1 schematically illustrates a highly enlarged portion of an embodiment of a multi-chip semiconductor connector 20 that may be utilized to attach together a plurality of semiconductor die. Connector 20 includes a first conductive strip 31 that includes a connection portion 22, a support portion 23, and a semiconductor die attachment area or attachment area 21. A second conductive strip 32 of connector 20 has a support portion 30, a connection portion 28, and a semiconductor die attachment area or attachment area 29. Strips 31 and 32 are identified in a general manner by arrows. An insulator 26 is positioned between first conductive strip 31 and second conductive strip 32 to provide electrical isolation therebetween and mechanical support therefor.

Figure 2:
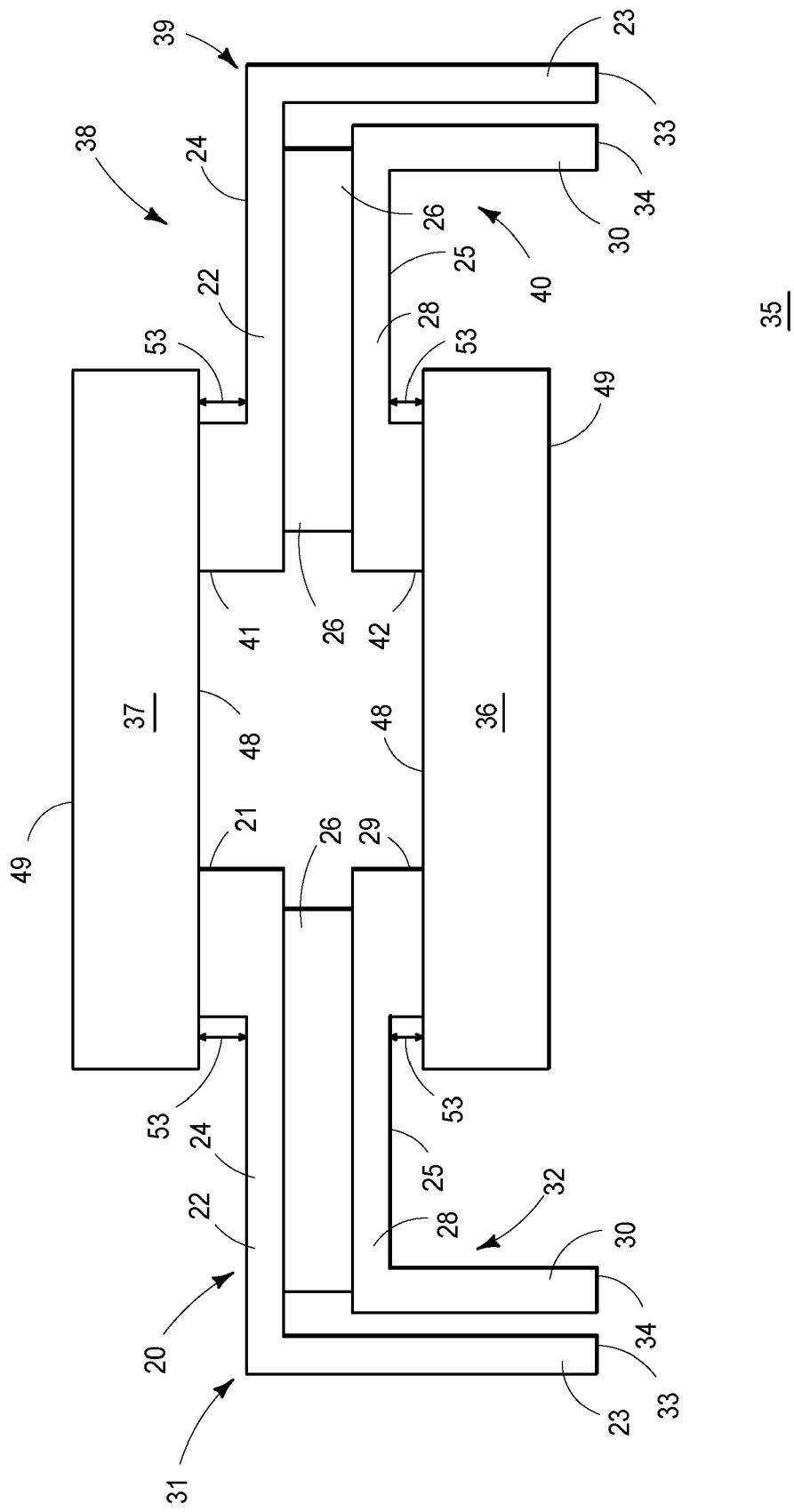
FIG. 2 schematically illustrates an enlarged cross-sectional portion of an embodiment of a multi-chip semiconductor connector assembly that utilizes the multi-chip semiconductor connector from FIG. 1 in accordance with the present invention.

FIG. 2 schematically illustrates an enlarged cross-sectional portion of an embodiment of a multi-chip semiconductor connector assembly 35 that utilizes connector 20 from FIG. 1 as one connector of a plurality of multi-chip semiconductor connectors to attach a first semiconductor die 36 to a second semiconductor die 37. This description will have references to both FIG. 1 and FIG. 2. Assembly 35 also includes a second multi-chip semiconductor connector 38 that is an alternate embodiment of connector 20 that was explained in the description of FIG. 1. Connector 38 includes a first conductive strip 39 that has support portion 23, connection portion 22, and a first attachment area 41. A second conductive strip 40 of connector 38 has support portion 30, connection portion 28, and a second attachment area 42. Connector 38 and strips 39 and 40 are identified in a general way by arrows.

Semiconductor die 36 and 37 typically have a top side or front side 48 that has a plurality of connection points and a bottom or backside 49 that typically has a single connection point. Such backside and front side connection points and electrodes and methods of forming them are well known to those skilled in the art. For example, die 36 and 37 may be power transistors that have a source and gate connection point on front side 48 and a drain connection point on backside 49. One or both of die 36 and 37 may also be a diode, an IGBT, an analog or a digital logic semiconductor device, or any other type of semiconductor device. The different connection points on each of die 36 and 37 may have different sized attachment pads or connection points, thus, the attachment area of connectors 20 and 38 may have different sizes or surface areas in order to mate to the corresponding connection points on die 36 and 37. For example, a source pad or source connection point may have a larger surface area than a gate pad or gate connection point in order to support a larger current flow, and a drain pad or drain connection point may have an even larger area than the source connection point. Consequently, attachment areas 41 and 42 of connector 38 are formed to have a larger surface area than attachment areas 21 and 29 in order to mate to the respective connection points of die 36 and 37.

In order to form electrical connection to the connection points of die 36 and 37, strips 31, 32, 39, and 40 typically are formed from a conductive material that is suitable for being attached to the connection points of die 36 and 37, such as solder or conductive epoxy, and that provides a low resistance electrical conduction path. Additionally, connection portions 23 and 30 assist in supporting the weight of assembly 35, thus, the material utilized to form connectors 20 and 38 must also provide rigidity and support. The rigidity typically is a modulus of elasticity no less than about $10 \times 10^6$ PSI. Suitable materials for strips 31, 32, 39, and 40 include copper, copper alloys, alloy-42, plated copper, copper plated with nickel, plated aluminum, plated plastic, and plated ceramic, for example ceramic that is machined to a shape and plated to provide conductivity. Plating materials include copper, silver, multi-layer plating such as nickel-palladium-and gold. Strips 31, 32, 39, and 40 have a width 80 and a thickness 27 of that are selected to provide the support required for supporting semiconductor die and to withstand semiconductor die and package assembly operations. In one exemplary embodiment, strips 31, 32, 39, and 40 are formed from copper with thickness 27 ranging between about fifteen to fifty (15-50) microns and width 80 ranging between about twenty to fifty (20-50) microns. It will be appreciated that strips 31, 32, 39, and 40 may all have different widths and thickness and that the width and thickness of support portions 23 and 30 may be different than the width and thickness of connection portions 22 and 28. Additionally, connection portions 22 and 28 may have various shapes when viewed from a plan view including circular, arcs of circles, or polygons. Although each of strips 31 and 32 are illustrated to have connection portions extending from only one side, it will be appreciated that any of strips 31 and 32 may have connection portions extending from all four sides of support portions 22 and 28, or extending from only one side, or extending from any combination of sides. Attachment areas 21 and 29 do not have to be vertically aligned to each other but are positioned to mate to the connection points of die 36 and 37. In some embodiments, areas 21 and 29 may attach to different types of connection points that are located in different positions, thus, areas 21 and 29 may be in different locations and not aligned to each other. Attachment areas 21, 29, 41, and 42 typically are formed as raised areas on a portion of the major surface of support portions 22 and 28. Areas 21 and 41, and areas 29 and 42 typically extend a first distance 53 from a major surface of respective portions 22 and 28, for example extending from a first major surface 24 of portion 22. As will be seen further hereinafter, first distance 53 generally is selected to be approximately no less than the bond-line thickness of the attachment material that is utilized to attach areas 21 and 41 to die 37 and areas 29 and 42 to die 36. Additionally, first distance 53 should be sufficient to ensure that the attachment material utilized to attach connectors 20 and 38 to die 36 and 37 sufficiently wets to areas 21, 29, 41, and 42. First distance 53 generally ranges from about fifteen to fifty microns. As is well known in the art, a portion of the connection points on die 36 and 37 may be covered by a passivation layer, thus, the exposed surface area of the connection point may be less than the total surface area of the connection point. The surface area of each of attachment areas 21, 29, 41, and 42 usually is formed to be less than the surface area of the exposed part of the corresponding connection point of dies 36 and 37. Forming the surface area of each of attachment areas 21, 29, 41, and 42 less that the corresponding connection point allows the surface tension of the attachment medium to assist in keeping attachment areas 21, 29, 41, and 42 properly aligned during the attachment process. In most embodiments, support portions 23 and 30 are formed in a different plane from the plane of connection portions 22 and 28 so that portions 23 and 30 may extend from die 36 and 37 to provide external connections to die 36 and 37. Support portions 23 and 30 form an angle 45 that generally is between about eighty-five and one hundred thirty-five degrees (85°-135°) to connection portions 22 and 28. A distal end 33 of strips 31 and 39 and a distal end 34 of strips 32 and 40 generally are used to attach assembly 35 to an intermediate substrate such as a printed circuit board or a ceramic substrate or a semiconductor device leadframe. Additionally, assembly 35 may be used as an assembly that is encapsulated to form a semiconductor package. Connectors 20 and 38 are mechanically attached to and electrically connected to die 36 and 37 so that die 36 and 37 generally are in different planes. As can be seen, at least the surface of front side 48 of die 37 is in a different plane from the surface of front side 48 of die 36. Typically, the two planes do not intersect. In most embodiments, the two planes are approximately parallel.

Insulator 26 provides electrical insulation between strips 31 and 32 and between strips 39 and 40 and also provides sufficient rigidity to support at least the weight of die 37. Suitable materials for insulator 26 include KAPTON tape, polyimide, BT resin, epoxy, fiberglass-epoxy, ceramic, and an oxide layer or coating that is deposited onto strips 31, 32, 39, and 40 or a layer of the material of strips 31, 32, 39, and 40 that is oxidized. For example strip 32 may be formed from copper or aluminum that is oxidized to have a layer of copper oxide or aluminum oxide on a portion of the surfaces of connector 20. KAPTON is a registered trademark of E. I. Du Pont De Nemours Inc., of 1007 Market St. Wilmington Del. Insulator 26 typically only is attached to a portion of the second major surface of connection portions 22 and 28 and does not extend either to the attachment area or to a distal end at the intersection with the support portion. This provides mechanical support for die 36 and 37 and allows support portions 23 and 30 to be routed to other points as required to form the desired electrical connections to die 36 and 37.

Assembly 35 can also include a conductor 43 that only has a single attachment area and only attaches to a single die.

Assembly 35 can be mounted directly onto a substrate such as a printed circuit board or a ceramic substrate, or may be used as an assembly that is encapsulated to form a semiconductor package.

Figure 3:
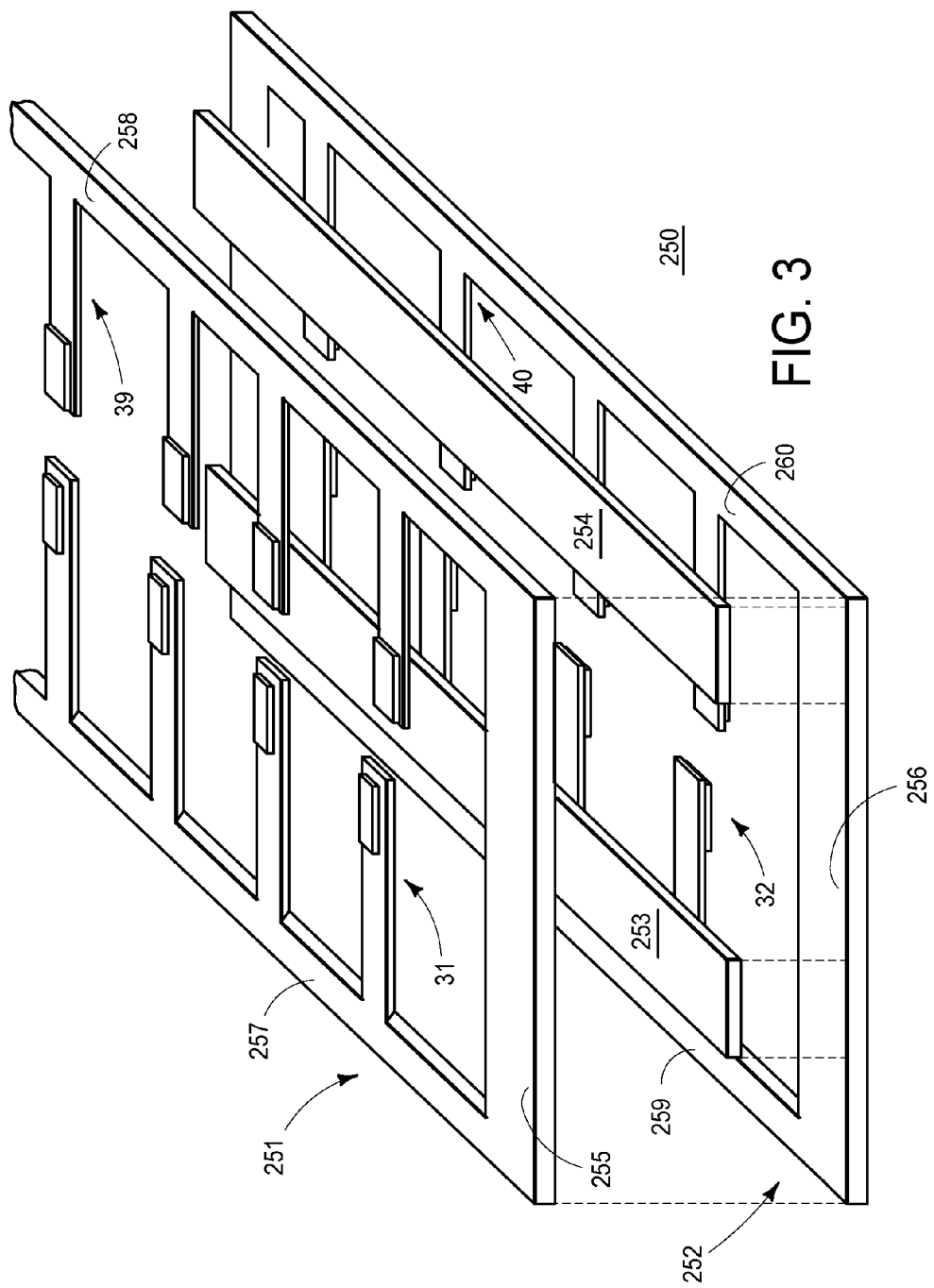
FIG. 3 schematically illustrates an enlarged exploded isometric view of a portion of an embodiment of a multi-chip semiconductor connector leadframe assembly in accordance with the present invention.

FIG. 3 schematically illustrates an enlarged exploded isometric view of a portion of an embodiment of a leadframe assembly 250 according to one method for forming connectors 20 and 38 and assembly 35. Leadframe assembly 250 includes a first leadframe panel 251, a second leadframe panel 252, and a plurality of insulator strips including a first insulator strip 253 and a second insulator strip 254. Leadframe panel 251 includes a main panel section 255 and a plurality of leadframe strips including a first leadframe strip 257 and a second leadframe strip 258. Similarly, leadframe panel 252 includes a main panel section 256 and a plurality of leadframe strips including a third leadframe strip 259 and a fourth leadframe strip 260. As is well known in the art, panels 251 and 252 generally have alignment holes or marks (not shown) that are used for aligning panels 251 and 252.

Leadframe panels 251 and 252 typically are formed by stamping or etching or half-etching a sheet of the material from which strips 31, 32, 39, and 40 of connectors 20 and 38 are formed. Prior to forming the sheet of material into panels 251 and 251, the sheet of the material generally is coined in order to form attachment areas 21, 29, 41, and 42. Panels 251 and 252 are then formed from the sheet of material. Alternately, panels 251 and 252 may be formed by cold-stamping the sheet of material. During the cold-stamping process, attachment areas 21, 29, 41, and 42 are formed as the sheet of material is compressed by the cold-stamping tool as will be seen further hereinafter. Insulator strips 253 and 254 can be attached to one of panels 251 or 252. Strips 253 and 254 typically are Kapton tape. The Kapton tape generally has one side that has an adhesive attached thereto. The adhesive side is attached to one of panels 251 or 252. A second adhesive is applied to the other side of the tape. One suitable adhesive for applying onto the Kapton tape is commonly referred to as Elephane FC manufactured by Tomoegawa, Inc. of Wheeling, Ill., a wholly owned subsidary of Tomoegawa Paper Company, Ltd. of Tokoyo Japan. Such adhesives and methods of applying them are well known in the art. The other panel is then positioned onto the second adhesive to form leadframe assembly 250.

In a second embodiment of a method of forming assembly 250, B-stage epoxy may be applied to the appropriate portions of connection portions 22 and 28 of one of panels 251 or 252 instead of the Kapton tape. The other panel can then be placed onto the B-stage epoxy and aligned with the first panel. Thereafter, the B-stage epoxy may be cured to form insulators 26.

In another embodiment of a method of forming assembly 250, panels 251 and 252 are stamped or etched from a sheet of the material from which strips 31, 32, 39, and 40 are formed. Areas 21, 29, 41, and 42 are also separately stamped or etched, for example from a sheet of the material. After the stamping operations, attachment areas 21, 29, 41, and 42 are attached to the corresponding positions on leadframe strips 257-260 by solder re-flow or conductive epoxy attachment methods. Panels 251 and 252 are then assembled as described hereinbefore.

Figure 4:
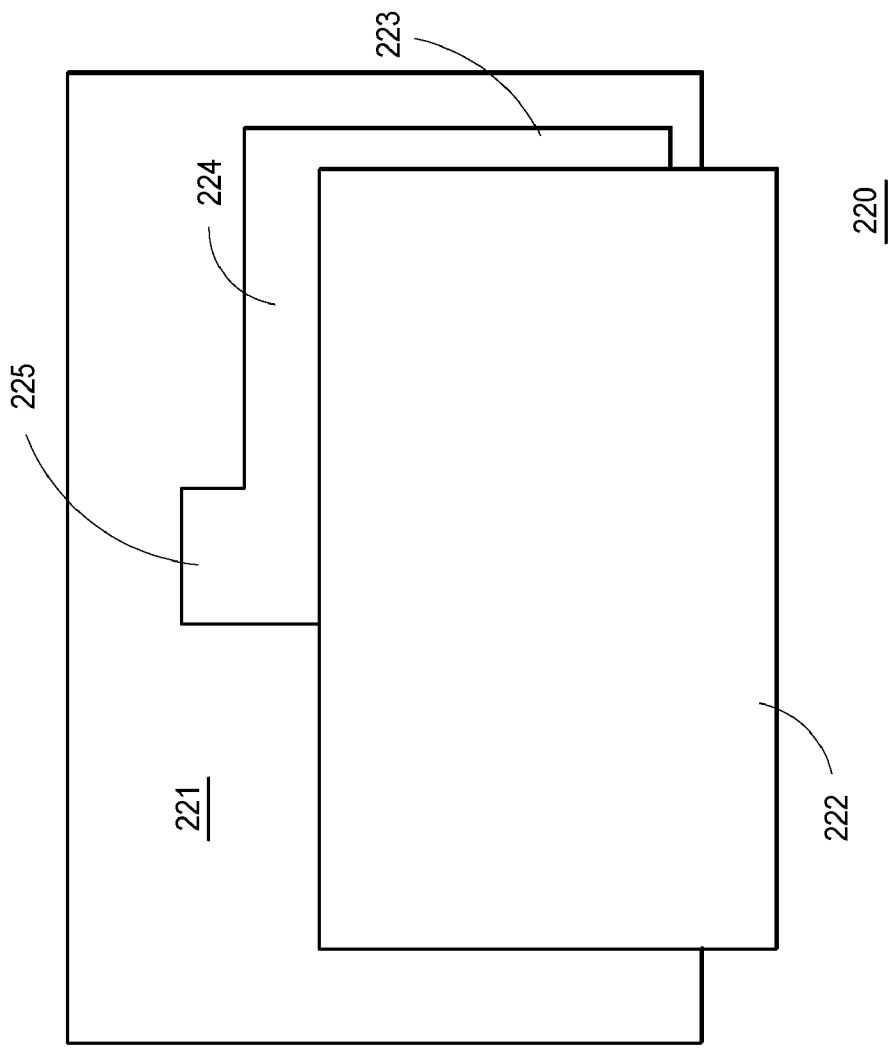
FIG. 4 schematically illustrates an enlarged cross-sectional portion of an embodiment of an apparatus that may be used for forming at least a portion of the multi-chip semiconductor connector of FIG. 1 in accordance with the present invention.

FIG. 4 schematically illustrates a cross-sectional view of an embodiment of a cold-stamping die 220 that may be used in forming strips 31, 32, 39, and 40 including areas 21, 29, 41, and 42 explained in the description of FIG. 1 and FIG. 2. Cold-stamping die 20 includes an upper die 221 and a lower die 222 that can be alternately separated and closed. When die 221 and 222 are closed together a cavity is formed that includes a first cavity portion 223, a second cavity portion 224, and a third cavity portion 225. Die 220 is illustrated in a closed position. The exemplary illustrated embodiment of cold-stamping die 220 may be used to form leadframe strips with the connection and support portions of strips 31, 32, 39, and 40 bent into different planes instead of the planar leadframe illustrated in FIG. 3. For example, die 221 can be raised and the material used for forming strip 31 may be placed on die 222. Die 221 is lowered to bend the material into the shape desired for strip 31 and to compress a portion of the material into cavity 225 to form area 21. Thereafter, an assembly similar to assembly 250 can be formed by the techniques described in the description of FIG. 3. In such an assembly, the connection and support portions of connectors 20 and 38 are bent into different planes instead of the planar leadframe illustrated in FIG. 3.

Connectors 20 and 38 can be attached to die 36 and 37 by a variety of methods. In one embodiment of a method of forming assembly 35, leadframe assembly 250 is soldered onto a plurality of die to form a plurality of multi-chip semiconductor connector assemblies such as multi-chip semiconductor connector assembly 35. Such assembly techniques are further described in previously identified and incorporated related application entitled "Multi-Chip Semiconductor Connector Assembly Method" having inventors Carney et al.

Figure 5:
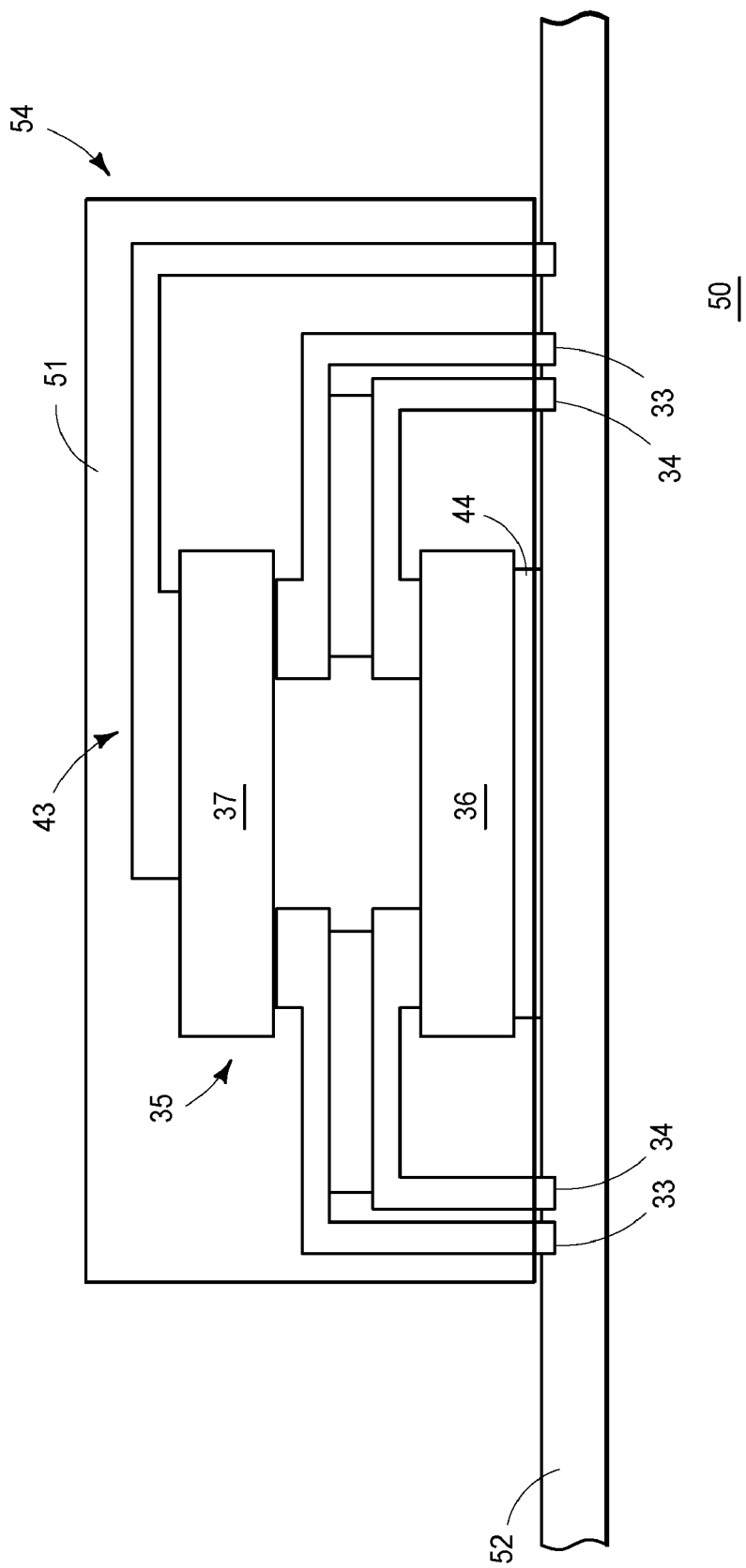
FIG. 5 schematically illustrates an enlarged cross-sectional portion of an embodiment of a semiconductor device that utilizes the multi-chip semiconductor connector assembly of FIG. 2 in accordance with the present invention.

FIG. 5 schematically illustrates an enlarged cross-sectional portion of an embodiment of a semiconductor device 50 that utilizes assembly 35 within a semiconductor package 54 having a package body 51. Package 54 is illustrated in a general way by an arrow. In some cases, die 36 may be attached to a flag 44 of a lead frame to provide a connection to backside 49. For example, die 36 may be attached to flag 44 prior to attaching connectors 20 and 38 to die 36 and 37. Such flags and methods of attaching die thereto are well known in the art.

The rigidity of strips 31, 32, 39, and 40 mechanically support die 36 and 37 and eliminates the need for an attaching an insulating material to die 36 and 37 to provide the mechanical support. The large surface area of strips 31, 32, 39, and 40 provides low resistance and high thermal conductivity thereby increasing the thermal capacity of package 54 and reducing the lead resistance.

Figure 6:
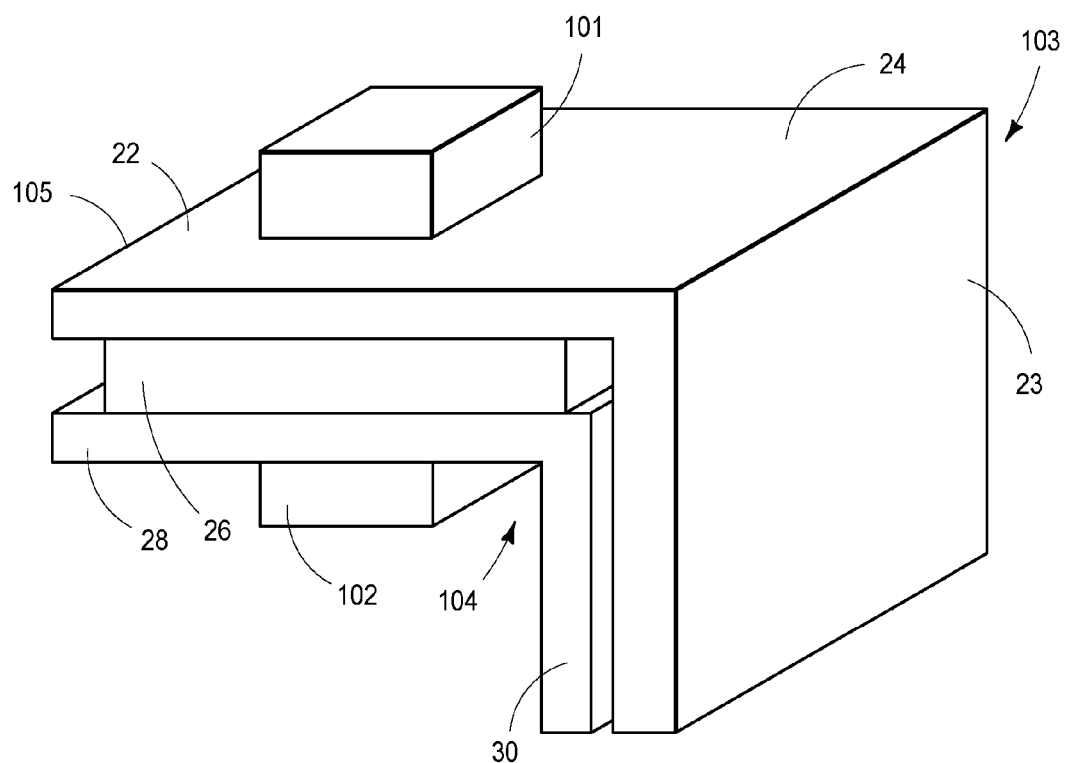
FIG. 6 schematically illustrates an enlarged isometric view of a multi-chip semiconductor connector that is an alternate embodiment of the multi-chip semiconductor connector of FIG. 1 in accordance with the present invention.

FIG. 6 schematically illustrates an enlarged isometric view of a multi-chip semiconductor connector 100 that is an alternate embodiment of connectors 20 and 38 explained in the description of FIG. 1 through FIG. 5. Connector 100 includes a first conductor strip 103 that is an alternate embodiment of strips 31 and 39, and a second conductor strip 104 that is an alternate embodiment of strips 32 and 40. Strips 103 and 104 are identified in a general manner by arrows. Strip 103 has an attachment area 101 that is positioned on surface 24 spaced apart from a distal end 105 of portion 22. Similarly, an attachment area 102 is positioned on a surface of portion 28 and is spaced apart from a distal end of portion 28. Positioning attachment areas 101 and 102 spaced apart from the distal end facilitates aligning attachment areas 101 and 102 to the corresponding connection points on the semiconductor die to which connector 100 is subsequently attached. Connector 100 may be used in place of connectors 20 or 38 for assembly 35. Strips 31, 32, 39, 40, 103, and 104 may be formed by the methods described hereinbefore.

Figure 7:
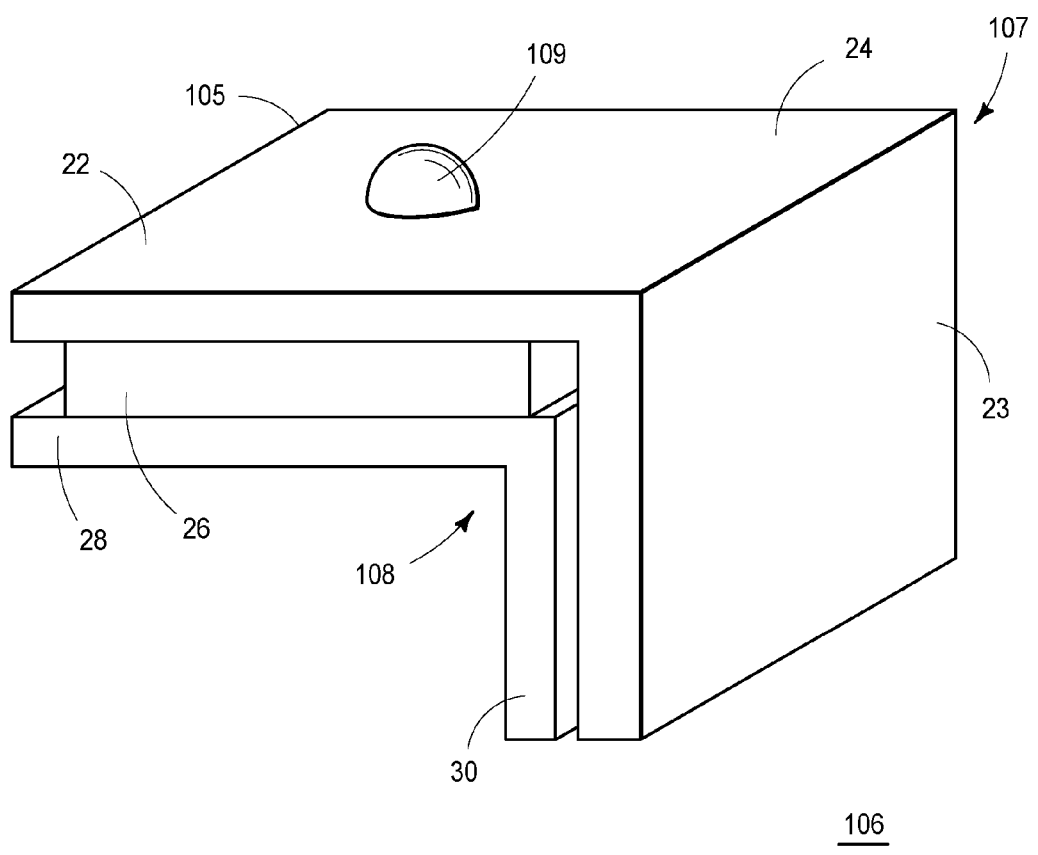
FIG. 7 schematically illustrates an enlarged isometric view of another multi-chip semiconductor connector that is an alternate embodiment of the multi-chip semiconductor connector of FIG. 1 and FIG. 6 in accordance with the present invention.

FIG. 7 schematically illustrates an enlarged isometric view of a multi-chip semiconductor connector 106 that is an alternate embodiment of connectors 20, 38, and 100 explained in the description of FIG. 1 through FIG. 6. Connector 106 includes a first conductive strip 107 and a second conductive strip 108 that are alternate embodiments of respective strips 31 and 32 that were described in the description of FIG. 1 through FIG. 6. Portions 22, 23, 28, and 30 of strips 107 and 108 may be formed in a manner similar to forming strips 31 and 32. Strips 107 and 108 include attachment areas 109 that are positioned on surface 24 of portion 22 and on the second major surface of portion 28. Areas 109 may be spaced apart from distal end 105 similarly to areas 101 and 102 or may be positioned adjacent to end 105 similarly to areas 21 and 29.

In one embodiment of a method of forming connector 106, attachment areas 109 are formed as areas of solder that are selectively applied to and attached to portions 22 and 28. The solder used for area 109 may be a solder ball that is positioned on portions 22 or 28 and reflowed to form area 109. Alternately, the solder may be screen printed onto portion 22 or some of portion 22 may be masked leaving only the attachment area exposed for applying solder to portion 22. The solder may be applied by dipping strips 107 and 108 into molten solder or by other similar techniques. The solder selectively applied to portion 22 typically has a higher melting point than solder used to attach area 109 to the connection points of a semiconductor die such as die 36 or 37.

In another embodiment, attachment areas 109 are formed as ball-bonds attached to portions 22 and 28. Ball-bonds generally are formed by thermo-sonically bonding an end of a bonding wire to a substrate, such as portion 22, and severing the bonding wire leaving an approximately ball-shaped portion of the bonding wire attached to the substrate. The ball-bond generally is formed from copper or gold or a gold alloy. Such ball-bonds and methods of forming them are well known in the art. For example, the ball-bonds may be formed on the attachment areas of each leadframe panel of panels 251 and 252 (FIG. 3) prior to attaching panels 251 and 252 together or may be formed in selected positions on the sheet of material prior to forming the material into panels 251 and 252.

Figure 8:
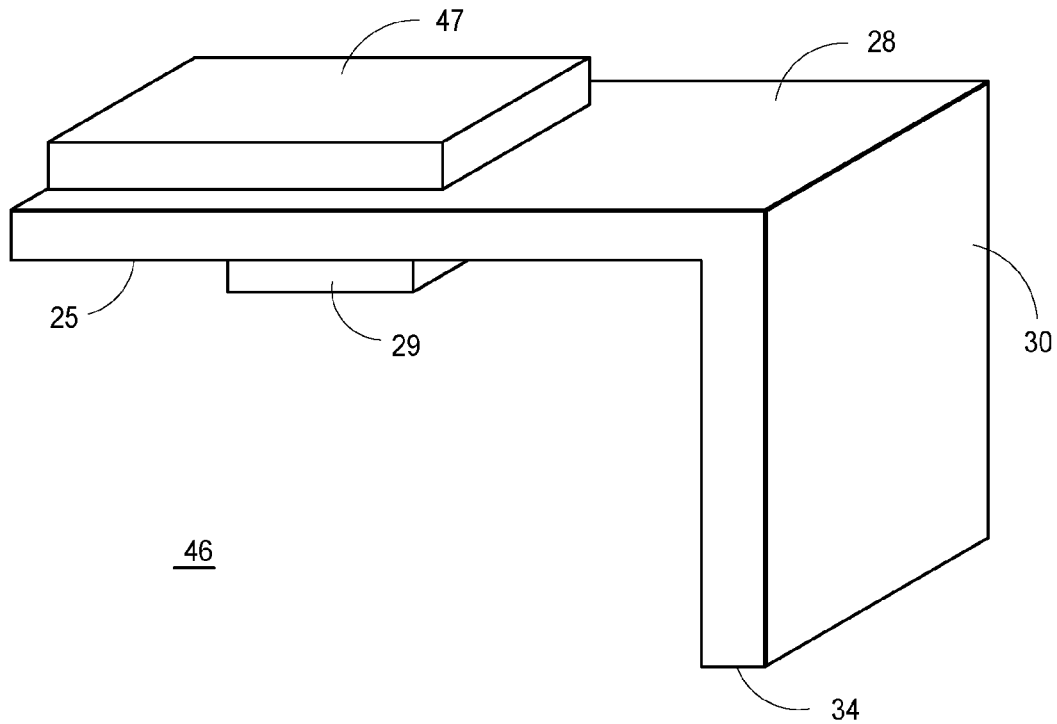
FIG. 8 schematically illustrates an enlarged isometric view of another multi-chip semiconductor connector that is an alternate embodiment of the multi-chip semiconductor connector of FIG. 1, FIG. 5, and FIG. 7 in accordance with the present invention.

FIG. 8 schematically illustrates an enlarged cross-sectional portion of a multi-chip semiconductor connector 46 that is an alternate embodiment of connectors 20, 38, 100, and 106 that were explained in the description of FIG. 1 through FIG. 7. Connector 46 is utilized to form a mechanical attachment and a common electrical connection between connection points on two semiconductor die such as die 36 and die 37, instead of electrically isolated connections that were formed by connectors 20, 38, 100, and 106. For example, if die 36 and 37 are power MOS transistors, connector 46 may be utilized to form a common connection between a source of transistors on die 36 and a drain of transistors on die 37. Connector 46 is an alternate embodiment of conductive strip 32 and includes attachment area 29 on a bottom surface of portion 28 and an attachment area 47 on a top surface of portion 28. The surface area of attachment area 47 is larger than the surface area of attachment area 29 in order to provide a low resistance connection between connection points that have different sizes. Alternately, areas 47 and 29 may have the same size in order to provide electrical connection between two connection points of the same size, for example two source connection points. Connector 46 may be formed by any of the techniques described hereinbefore.

Figure 9:
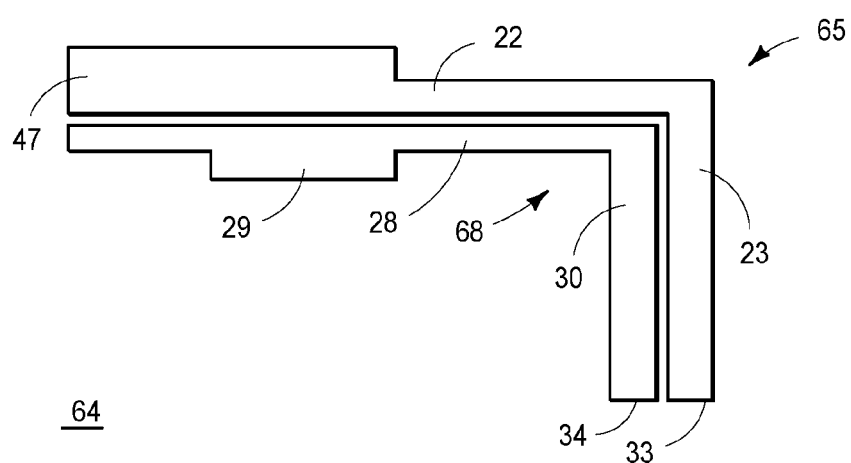
FIG. 9 schematically illustrates an enlarged isometric view of another multi-chip semiconductor connector that is an alternate embodiment of the multi-chip semiconductor connector of FIG. 8 in accordance with the present invention.

FIG. 9 schematically illustrates an enlarged cross-sectional portion of a multi-chip semiconductor connector 64 that is an alternate embodiment of connector 46 that was explained in the description of FIG. 8. Connector 64 includes a first conductive strip 65 and a second conductive strip 68. Strip 65 includes connection portion 22, support portion 23, and attachment area 47. Strip 68 includes connection portion 28, support portion 30, and attachment area 29. Strip 65 is mechanically and electrically attached to strip 68 in order to provide the desired electrical connection between the two connection points of two semiconductor die. Strip 65 may be attached to strip 68 using solder reflow techniques or conductive epoxy attachment techniques. For example, strips 65 and 68 may be formed as a portion of leadframe panels such as respective panels 251 and 252 (FIG. 3). The panels can be soldered together to form a leadframe assembly having a plurality of connectors 64. In such a case, the solder used to attach strips 65 and 68 may have a higher melting temperature than solder used to attach conductor 64 to the semiconductor die. Alternately, the same type of solder may be used to attach strips 65 and 68 and to attach conductor 64 to semiconductor die. In such a case, strips 65 and 68 are attached by the same reflow operation used to attach connector 64 to the semiconductor die. In another embodiment, strips 65 and 68 are attached together by conductive epoxy. In this embodiment, connector 64 can be used like connector 63 without concern for solder used within connector 64.

Figure 10:
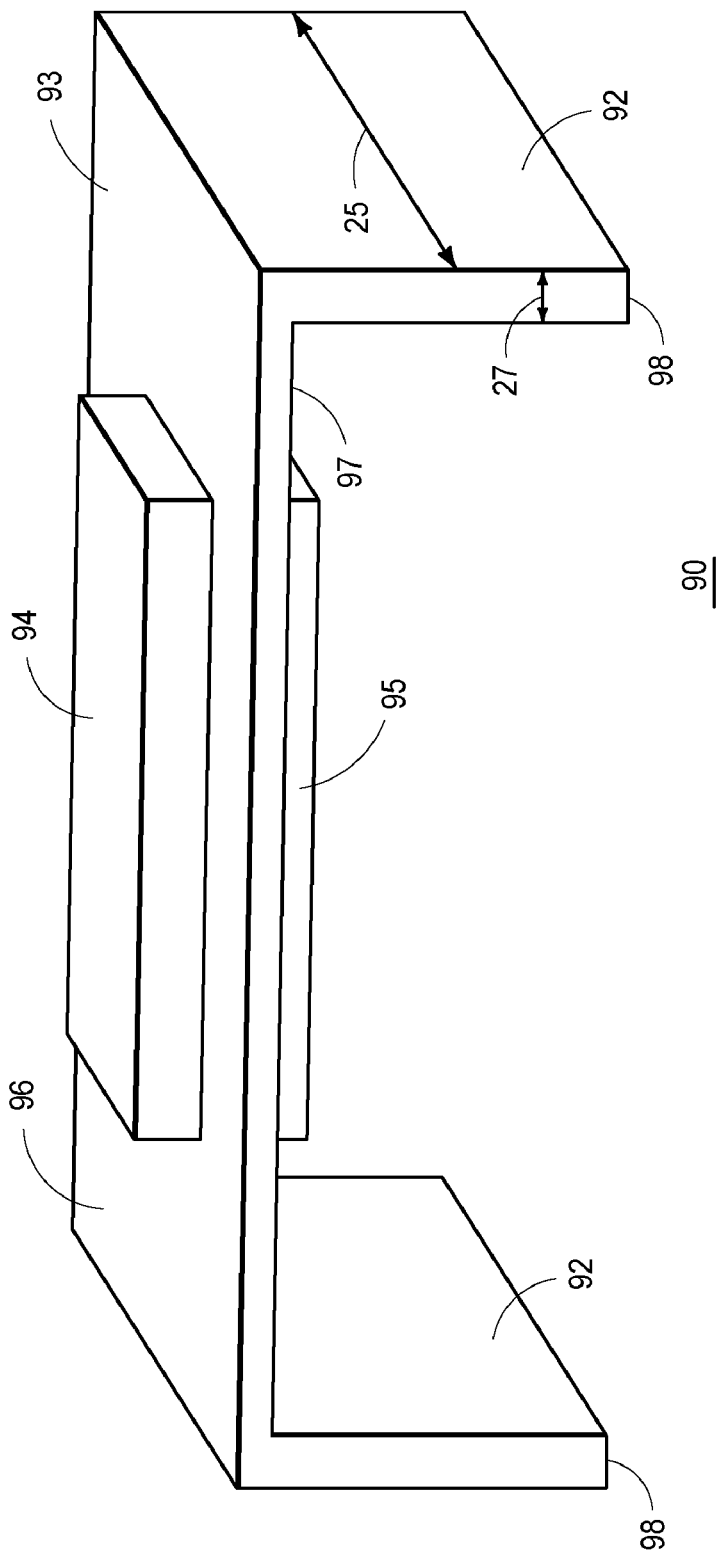
FIG. 10 schematically illustrates an enlarged isometric view of another multi-chip semiconductor connector that is an alternate embodiment of the multi-chip semiconductor connector of FIG. 8 in accordance with the present invention.

FIG. 10 schematically illustrates a highly enlarged isometric view of a multi-chip semiconductor connector 90 that is an alternate embodiment of connector 46 and 64 that were explained in the respective descriptions of FIG. 8 and FIG. 9. Connector 90 may be utilized to commonly connect together high current connection points of two semiconductor die, for example the drain electrodes of two power semiconductor devices. Connector 90 is formed to have attachment areas on both surfaces in order to facilitate commonly connecting the two connection points. Connector 90 includes a connection portion 93, a plurality of support portions 92, a first attachment area 94 that is on a first surface 96 of portion 93, and a second attachment area 95 that is on a second surface 97 which is opposite to surface 96. Support portions 92 are positioned at opposite ends of portion 93 so that connector 90 may provide mechanical support of die attached thereto. The positioning of support portions 92 provides connector 90 with an inverted "U" shape. In other embodiments, connector 90 may have support portions extending from all four sides of connection portion 93 or extending from only one side, or extending from any combination of sides. Support portions 92 also have distal ends 98 that function similarly to distal ends 33 and 34. Connector 90 also may be formed by any of the techniques described for forming connectors 20, 38, 46, 64, 100, or 106.

In view of all of the above, it is evident that a novel device and method is disclosed. Included, among other features, is forming a connector that can mechanically attach two semiconductor die together and electrically connect to the two semiconductor die to provide external electrical connections thereto. The rigidity of the connector provides support for the die and eliminates the need for an intermediate adhesive support layer. Eliminating the intermediate support layer improves the thermal dissipation of the resulting assembly. Using the connector to form both mechanical and electrical connection eliminates the need for wire bonding and reduces the footprint of the resulting assembly. Using the connector also facilitates minimizing the thickness of the resulting semiconductor package thereby further improving thermal dissipation.

The invention claimed is:

1. A multi-chip connector comprising:
   a first conductive strip having a first connection portion and a first support portion, the first connection portion having a first major surface and a second major surface;
   a first semiconductor die attachment area on the first major surface of the first support portion of the first conductive strip wherein the first semiconductor die attachment area is formed on the first conductive strip prior to attaching the first conductive strip to a semiconductor die, the first semiconductor die attachment area extending a first distance from the first major surface of the first connection portion of the first conductive strip and being integral there with; and a second conductive strip underlying the first conductive strip, the second conductive strip having a second connection portion, a second support portion, and a second semiconductor die attachment area on a portion of the second connection portion wherein the second semiconductor die attachment area is formed on the second conductive strip prior to attaching the second conductive strip to a semiconductor die, the second semiconductor die attachment area extending from the second connection portion of the second conductive strip and being integral there with.

2. The multi-chip connector of claim 1 further including an insulator between the first conductive strip and the second conductive strip.

3. The multi-chip connector of claim 2 wherein the insulator is adjacent the second major surface of the first conductive strip.

4. The multi-chip connector of claim 2 wherein the insulator is one of polyimide or epoxy and wherein the insulator does not extend to a distal end of the first support portion or a distal end of the second support portion.

5. The multi-chip connector of claim 1 wherein the first connection portion is in a first plane and the first support portion is in a second plane.

6. The multi-chip connector of claim 1 wherein the first semiconductor die attachment area is one of a ball-bond or solder.

7. The multi-chip connector of claim 1 wherein the first semiconductor die attachment area is in a first plane and the second semiconductor die attachment area is in a second plane.

8. The multi-chip connector of claim 1 wherein a first semiconductor die is attached to the first semiconductor die attachment area and a second semiconductor die is attached to the second semiconductor die attachment area.

9. The multi-chip connector of claim 1 wherein the first semiconductor die attachment area is a portion of the first conductive strip that is formed to extend the first distance from the first major surface of the first connection portion.

* * * * *